(12) United States Patent
Handa et al.

(10) Patent No.: US 9,807,329 B2
(45) Date of Patent: Oct. 31, 2017

(54) IMAGING DEVICE AND IMAGING SYSTEM

(71) Applicant: CANON KABUSHIKI KAISHA, Tokyo (JP)

(72) Inventors: Yoichiro Handa, Tokyo (JP); Hajime Ikeda, Yokohama (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 133 days.

(21) Appl. No.: 14/717,867

(22) Filed: May 20, 2015

(65) Prior Publication Data
US 2015/0341584 A1 Nov. 26, 2015

(30) Foreign Application Priority Data

May 23, 2014 (JP) ................................. 2014-107478

(51) Int. Cl.
*H04N 5/359* (2011.01)
*H04N 5/378* (2011.01)
*H01L 27/146* (2006.01)
*H04N 5/3745* (2011.01)
*H04N 5/369* (2011.01)
*H04N 5/232* (2006.01)
*H04N 9/04* (2006.01)
*H04N 5/374* (2011.01)

(52) U.S. Cl.
CPC ... *H04N 5/37457* (2013.01); *H01L 27/14603* (2013.01); *H01L 27/14612* (2013.01); *H01L 27/14641* (2013.01); *H04N 5/23212* (2013.01); *H04N 5/3597* (2013.01); *H04N 5/3696* (2013.01); *H04N 5/3698* (2013.01); *H04N 5/374* (2013.01); *H04N 5/378* (2013.01); *H04N 9/045* (2013.01); *H01L 27/14623* (2013.01)

(58) Field of Classification Search
CPC .......... H04N 5/33212; H04N 5/37457; H04N 5/3696; H04N 5/3698; H04N 9/045; H01L 27/14641
See application file for complete search history.

(56) References Cited

U.S. PATENT DOCUMENTS

2012/0199883 A1* 8/2012 Kobayashi ........ H01L 27/14607
257/225
2013/0120624 A1* 5/2013 Okita ..................... H04N 5/335
348/300

FOREIGN PATENT DOCUMENTS

JP        2013-106194 A    5/2013

* cited by examiner

*Primary Examiner* — Twyler Haskins
*Assistant Examiner* — Fayez Bhuiyan
(74) *Attorney, Agent, or Firm* — Canon USA, Inc., IP Division

(57) ABSTRACT

An embodiment provides an imaging device including a pixel that includes a first photoelectric conversion portion, a second photoelectric conversion portion, a first transfer transistor, a second transfer transistor, and a floating diffusion portion. The first transfer transistor transfers a signal charge in the first photoelectric conversion portion to the floating diffusion portion. The second transfer transistor transfers a signal charge in the second photoelectric conversion portion to the floating diffusion portion. A potential at the first photoelectric conversion portion for the signal charge is higher than a potential at the second photoelectric conversion portion for the signal charge.

20 Claims, 10 Drawing Sheets

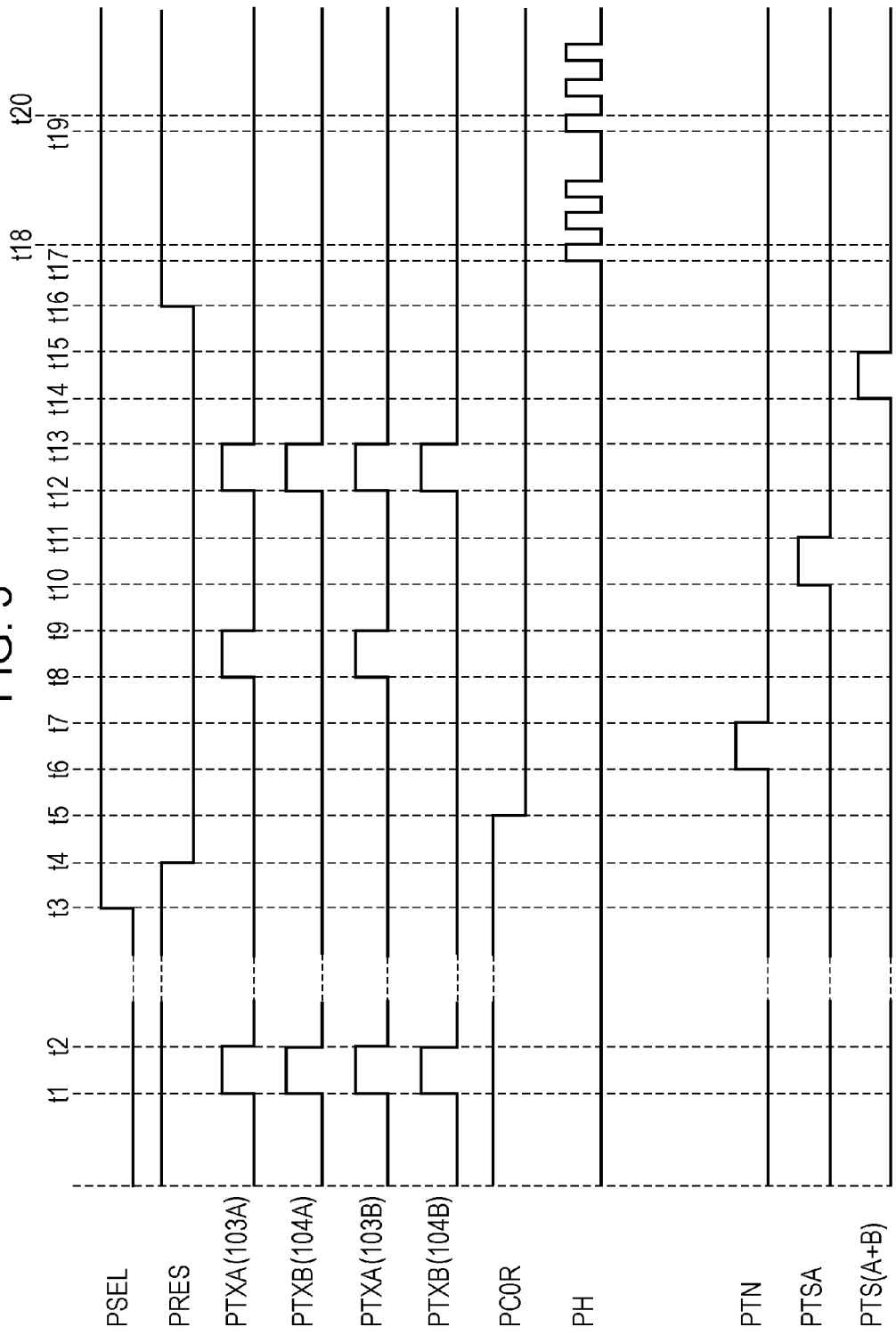

FIG. 6A
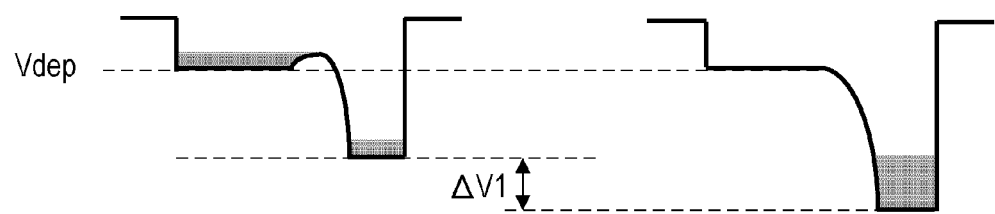
FIG. 6B
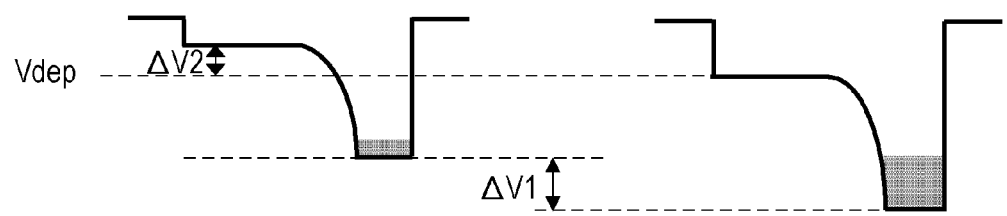

IMAGING DEVICE AND IMAGING SYSTEM

BACKGROUND

Technical Field

The present disclosure relates to an imaging device and an imaging system.

Description of the Related Art

Imaging devices capable of performing both focus detection and image capturing have been proposed. According to Japanese Patent Laid-Open No. 2013-106194, each pixel of an imaging device includes a first photoelectric conversion portion and a second photoelectric conversion portion. The first and second photoelectric conversion portions are each disposed to be substantially conjugate to the pupil of the lens. During focus detection, signals are read out independently from the first and second photoelectric conversion portions of a plurality of pixels, and two images are formed based on rays that have passed through different positions of the pupil of the lens. An image of a subject can be obtained (captured) by adding the signals from the first and second photoelectric conversion portions together.

Japanese Patent Laid-Open No. 2013-106194 also discloses an imaging device that includes a common amplifier for each pair of the first photoelectric conversion portion and the second photoelectric conversion portion. Specifically, a configuration of such an imaging device for outputting a signal based on a charge in the first photoelectric conversion portion and an added signal obtained by adding charges in the first and second photoelectric conversion portions is disclosed.

SUMMARY

An aspect of the present invention provides an imaging device including a pixel and a control unit. The pixel includes a first photoelectric conversion portion including a first semiconductor region configured to accumulate a signal charge, a second photoelectric conversion portion including a second semiconductor region configured to accumulate a signal charge, a charge holding portion, a first transfer transistor configured to transfer a signal charge in the first photoelectric conversion portion to the charge holding portion, and a second transfer transistor configured to transfer a signal charge in the second photoelectric conversion portion to the charge holding portion. The control unit is configured to perform a first control operation to set the first transfer transistor to be on while keeping the second transfer transistor off from a state where both the first transfer transistor and the second transfer transistor are off, and after performing the first control operation, a second control operation to set a state in which both of the first transfer transistor and the second transfer transistor are on. An impurity concentration of the first semiconductor region is lower than an impurity concentration of the second semiconductor region.

Another aspect of the present invention provides an imaging device including a pixel and a control unit. The pixel includes a first photoelectric conversion portion, a second photoelectric conversion portion, a charge holding portion, a first transfer transistor configured to transfer a signal charge in the first photoelectric conversion portion to the charge holding portion, and a second transfer transistor configured to transfer a signal charge in the second photoelectric conversion portion to the charge holding portion. The control unit is configured to perform a first control operation to set the first transfer transistor to be on while keeping the second transfer transistor off from a state where both the first transfer transistor and the second transfer transistor are off, and after performing the first control operation, a second control operation to set a state in which both of the first transfer transistor and the second transfer transistor are on. For a signal charge, a potential of the first photoelectric conversion portion is higher than a potential of the second photoelectric conversion portion.

Another aspect of the present invention provides an imaging device including a pixel and a lens provided correspondingly to the pixel. The pixel includes a first photoelectric conversion portion including a first semiconductor region configured to accumulate a signal charge, a second photoelectric conversion portion including a second semiconductor region configured to accumulate a signal charge, a charge holding portion, a first transfer transistor configured to transfer a signal charge in the first photoelectric conversion portion to the charge holding portion, and a second transfer transistor configured to be controlled independently from the first transfer transistor and configured to transfer a signal charge in the second photoelectric conversion portion to the charge holding portion. An impurity concentration of the first semiconductor region is lower than an impurity concentration of the second semiconductor region.

Further features of the present invention will become apparent from the following description of exemplary embodiments with reference to the attached drawings.

BRIEF DESCRIPTION OF THE DRAWINGS

FIG. 5 is a chart illustrating driving timings of the imaging device.

FIGS. 6A and 6B are diagrams schematically illustrating the potential in the imaging device.

DESCRIPTION OF THE EMBODIMENTS

According to some embodiments, both the saturation charge quantity of a pixel and the accuracy of focus detection are increased.

An increase in the maximum charge quantity which a pixel of imaging devices can handle, namely, the saturation charge quantity of a pixel, is desired. However, inventors have found that increasing the saturation charge quantity of a pixel may cause a residual charge that is left without being transferred. In particular, a residual charge is likely to be caused when a charge in one of photoelectric conversion portions is transferred for focus detection. As a result, the accuracy of focus detection undesirably decreases at a low illuminance.

In view of such issues, embodiments of the present invention allow imaging devices to have both an increased saturation charge quantity of a pixel and an increased accuracy of focus detection.

Figure 3:
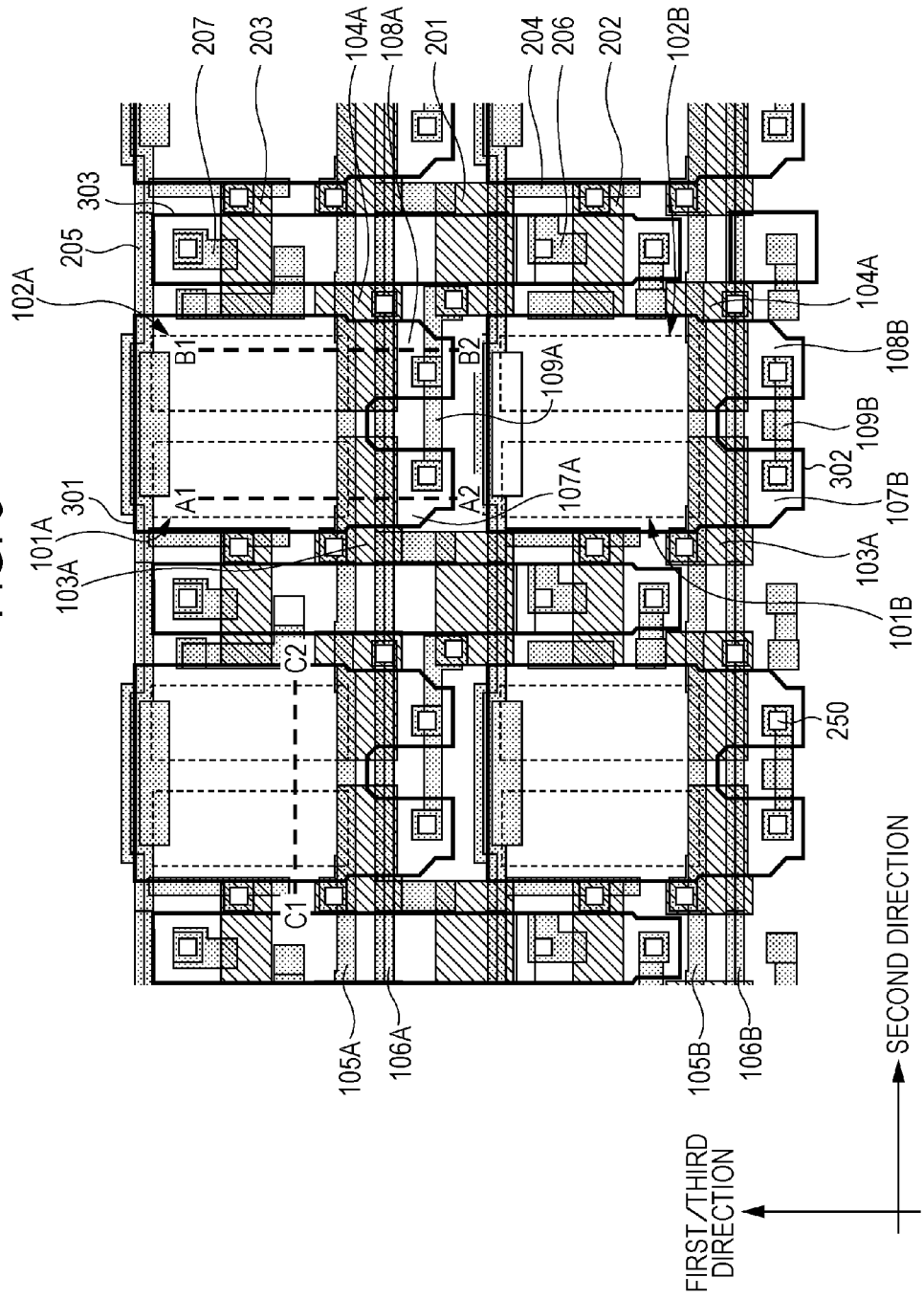
FIG. 3 is a plan view schematically illustrating a structure of the imaging device.

One embodiment of the present invention provides an imaging device. Each pixel included in the imaging device includes a first photoelectric conversion portion, a second photoelectric conversion portion, a first transfer transistor, a second transfer transistor, and a charge holding portion. An example case will be described herein where the charge holding unit includes a floating diffusion (hereinafter, abbreviated as FD) portion that is electrically connected to an input node of an amplifying portion. The first transfer transistor transfers a signal charge in the first photoelectric conversion portion to the FD portion. The second transfer transistor transfers a signal charge in the second photoelectric conversion portion to the FD portion. FIG. 3 illustrates a first photoelectric conversion portion 101A, a second photoelectric conversion portion 102A, a gate electrode of a first transfer transistor 103A, and a gate electrode of a second transfer transistor 104A. FIG. 3 also illustrates a first FD region 107A and a second FD region 108A that form the FD portion, and a conductive member 109A that electrically connects the first FD region 107A and the second FD region 108A to each other.

In some embodiments, the first photoelectric conversion portion includes a first semiconductor region configured to accumulate a signal charge, and the second photoelectric conversion portion includes a second semiconductor region configured to accumulate a signal charge. An impurity concentration of the first semiconductor region is lower than an impurity concentration of the second semiconductor region.

From another viewpoint, for a signal charge, a potential at the first photoelectric conversion portion is higher than a potential at the second photoelectric conversion portion. In the case where electrons serve as a signal charge, the state where a potential is high for a signal charge is the same as the state where voltage is low. In the case where holes serve as a signal charge, the state where a potential is high for a signal charge is the same as the state where voltage is high. In addition, a potential at a photoelectric conversion portion is a potential at a signal-charge accumulating semiconductor region of the photoelectric conversion portion when the entire semiconductor region is depleted, in a state where a voltage for switching on a transfer transistor is applied to the gate of the transfer transistor.

With such a configuration, firstly, a charge in the first photoelectric conversion portion is transferred to the FD portion. Then, two transfer transistors, each for a corresponding one of the first and second photoelectric conversion portions, are both switched on. Switching on both the two transfer transistors indicates that there is a period for which both the two transfer transistors are switched on. The two transfer transistors need not be switched from off to on at an identical timing. In addition, the two transfer transistors need not be switched from on to off at an identical timing. Switching off both the two transfer transistors indicates that there is a period for which both the two transfer transistors are switched off.

Specifically, an imaging device according to some embodiments includes a control unit configured to perform control to switch on or off the transfer transistors. The control unit performs a first control operation to set the first transfer transistor to be on while keeping the second transfer transistor off from a state where both the first and second transfer transistors are off. By the first control operation, a signal charge in the first photoelectric conversion portion is transferred to the FD portion. The control unit then performs a second control operation to set a state in which both of the first and second transfer transistors are on.

The control unit includes, for example, circuits such as a shift register and a decoder. In such a case, the first and second control operations include outputting a driving pulse for switching on or off a corresponding transfer transistor. In addition to the aforementioned configuration, various circuits that enable control of the transfer transistors are used in the control unit.

The second control operation may be performed in a state where at least part of the signal charge transferred by the first control operation is held in the FD portion. Such a control allows a first signal based on a charge in one of two photoelectric conversion portions to be read out and then an added signal based on the sum of charges in the two photoelectric conversion portions to be read out. In addition, a second signal based on a charge in the other photoelectric conversion portion can be obtained by subtraction processing on the first signal that has been read out first and the added signal.

In some embodiments, voltage at the FD portion is reset between the first control operation and the second control operation. Such a control allows a first signal based on a charge in one of two photoelectric conversion portions and a second signal based on a charge in the other photoelectric conversion portion to be read out independently.

Benefits of the above-described embodiments will be described. A potential at the first photoelectric conversion portion is higher than a potential at the second photoelectric conversion portion or an impurity concentration of a first semiconductor region included in the first photoelectric conversion portion is lower than an impurity concentration of a second semiconductor region included in the second photoelectric conversion portion. Such a configuration can reduce the amount of residual charge or make the amount of residual charge zero during the first control operation in which a charge in the first photoelectric conversion portion is transferred.

The potential at the second photoelectric conversion portion is relatively low in a depleted state or the impurity concentration of the second semiconductor region included in the second photoelectric conversion portion is relatively high. This configuration allows the second photoelectric conversion portion to have an increased saturation charge quantity. In addition, a charge is transferred from the second photoelectric conversion portion by the second control operation in which both the two transfer transistors are switched on. These configurations can reduce the amount of residual charge or make the amount of residual charge zero even if the potential at the second photoelectric conversion portion is relatively low.

As described above, according to some embodiments, both the saturation charge quantity of a pixel and the accuracy of focus detection are increased.

Exemplary embodiments of the present invention will be described in detail below with reference to the accompanying drawings. Note that the present invention is not limited to the exemplary embodiments described below. Modifications obtained by changing part of configurations of the exemplary embodiments described below within the scope not departing from the gist of the present invention should also be construed as embodiments of the present invention. In addition, exemplary embodiments obtained by adding part of configurations of any of the following exemplary embodiments to the other exemplary embodiments or by replacing part of configurations of any of the following exemplary embodiments with part of configurations of the other exemplary embodiments should also be construed as embodiments of the present invention.

First Exemplary Embodiment

Figure 1:
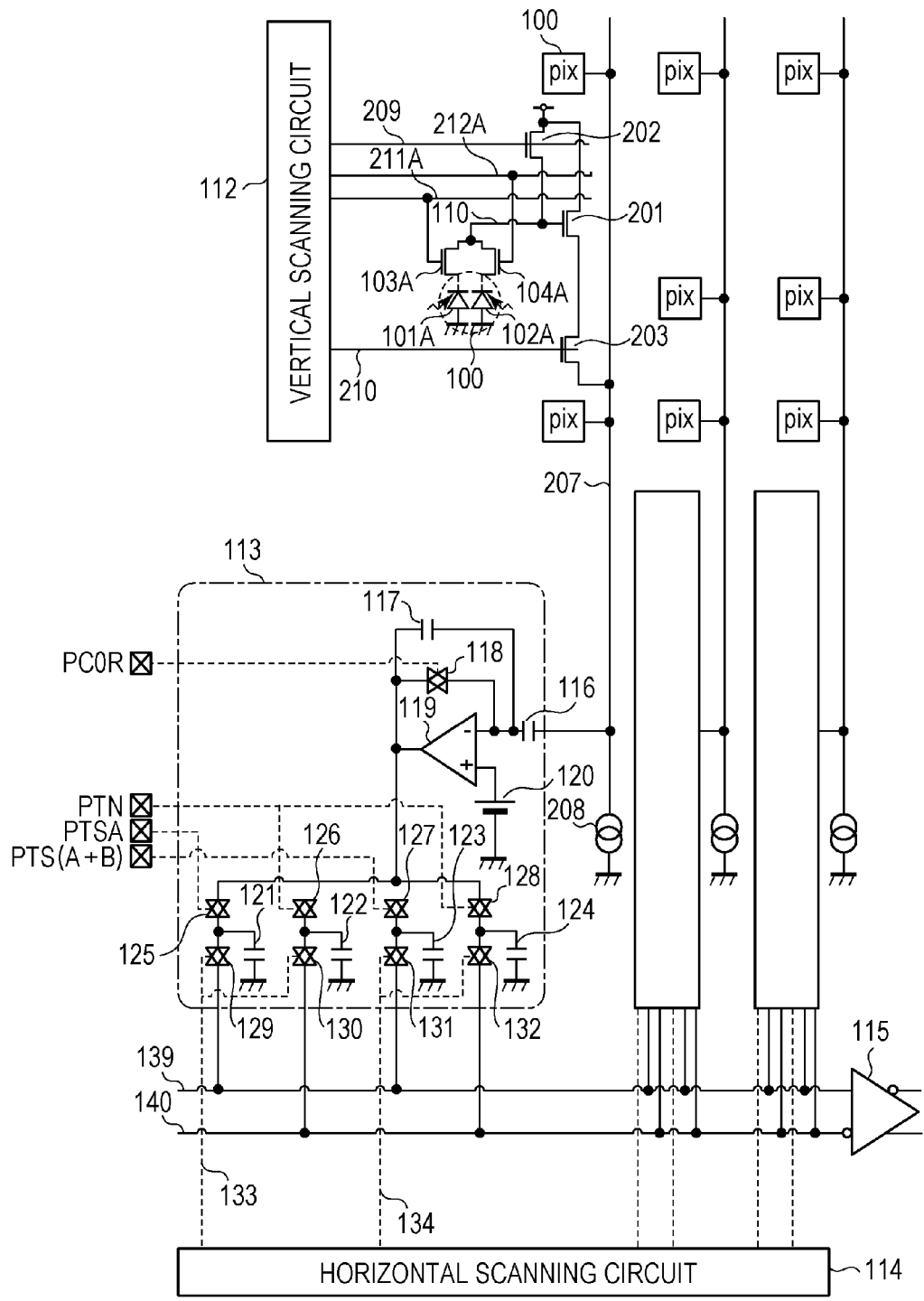
FIG. 1 is a diagram illustrating an equivalent circuit of an imaging device.

FIG. 1 is a diagram illustrating an equivalent circuit of an imaging device according to a first exemplary embodiment. Each pixel 100 includes a plurality of photoelectric conversion portions. Specifically, referring to FIG. 1, each pixel 100 includes the first photoelectric conversion portion 101A and the second photoelectric conversion portion 102A. For example, photodiodes can be used as the photoelectric conversion portions.

The first transfer transistor 103A and the second transfer transistor 104A are each provided for a corresponding one of the plurality of photoelectric conversion portions. The first transfer transistor 103A and the second transfer transistor 104A each transfer a charge in the corresponding photoelectric conversion portion to an FD portion 110. The FD portion 110 serves as an input node of an amplifying portion 201. In the first exemplary embodiment, the FD portion 110 is included in a charge holding portion. The amplifying portion 201 outputs a signal based on the charge transferred to the FD portion 110 to an output line 207. A metal oxide semiconductor (MOS) transistor can be used as the amplifying portion 201. A reset transistor 202 supplies the input node of the amplifying portion 201 with a reset voltage. A selection transistor 203 controls electrical conduction between the amplifying portion 201 and the output line 207. The output line 207 is electrically connected to a current source 208. The current source 208 supplies the amplifying portion 201 with a bias current. The amplifying portion 201 and the current source 208 form a source-follower circuit.

Gates of the first transfer transistor 103A, the second transfer transistor 104A, the reset transistor 202, and the selection transistor 203 are connected respectively to driving lines 211A, 212A, 209, and 210 and are sequentially or randomly supplied with a driving pulse from a vertical scanning circuit 112 on a row-by-row basis. In the first exemplary embodiment, the vertical scanning circuit 112 serves as a control unit.

A column circuit 113 receives a signal from the output line 207. The column circuit 113 is connected directly or via a switch to the output line 207. The signal processed by the column circuit 113 is sequentially output by a horizontal scanning circuit 114 to an output amplifier 115 and ultimately to outside the imaging device.

The column circuit 113 operates mainly to inversely amplifying the signal supplied from the output line 207 at a gain which is determined based on a capacitance value of an input capacitor 116 and a capacitance value of a feedback capacitor 117. The column circuit 113 is capable of performing a virtually grounded operation and a correlated double sampling (CDS) operation by a clamping operation using the input capacitor 116.

Now, an example of specific circuitry of the column circuit 113 will be described. A first node of the input capacitor 116 is electrically connected to the output line 207. A second node of the input capacitor 116 is electrically connected to an inverting input node of an operational amplifier 119. A first node of the feedback capacitor 117 is electrically connected to the inverting input node of the operational amplifier 119 and to the second node of the input capacitor 116. A second node of the feedback capacitor 117 is electrically connected to an output node of the operational amplifier 119. A switch 118 is provided in a feedback path between the inverting input node and the output node of the operational amplifier 119 in order to control an electrical connection therebetween. The feedback capacitor 117 and the switch 118 are connected in parallel to each other.

A power source 120 supplies a reference voltage Vref to a non-inverting input node of the operational amplifier 119. Holding capacitors 121, 122, 123, and 124 are capacitors that hold an output from the operational amplifier 119. Switches 125, 126, 127, to 128 are respectively provided in electrical paths between the operational amplifier 119 and the holding capacitors 121, 122, 123, and 124 and respectively control electrical conduction between the output node of the operational amplifier 119 and the holding capacitors 121, 122, 123, and 124. Switches 129, 130, 131, and 132 receive signals from the horizontal scanning circuit 114 via signal lines 133 and 134 and cause signals held by the holding capacitors 121, 122, 123, and 124 to be output to horizontal output lines 139 and 140. The output amplifier 115 outputs a differential signal of the signals output to the horizontal output lines 139 and 140 to outside the imaging device.

A driving pulse PCOR is supplied to the switch 118. A driving pulse PTN is supplied to the switches 126 and 128. A driving pulses PISA is supplied to the switch 125. A driving pulse PTS(A+B) is supplied to the switch 127.

Figure 2:
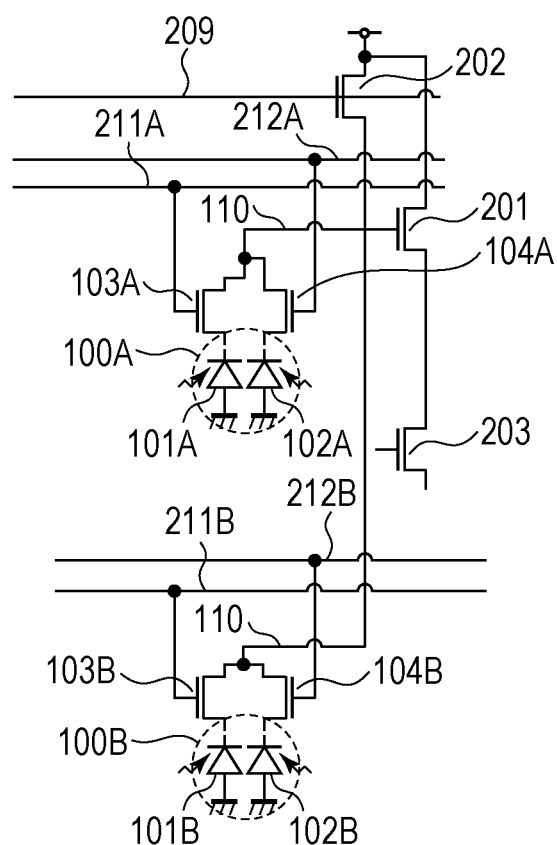
FIG. 2 is a diagram illustrating an equivalent circuit of the imaging device.

FIG. 1 illustrates a configuration in which the plurality of pixels 100 each include the amplifying portion 201; however, one amplifying portion 201 may be shared by a plurality of pixels, that is, a first pixel 100A and a second pixel 100B as illustrated in FIG. 2. In FIG. 2, components having functions that are substantially the same as those of components illustrated in FIG. 1 are denoted by the same reference numerals. Different alphabets following a reference numeral indicate that components are included in different pixels.

An imaging device illustrated in FIG. 2 includes the first pixel 100A which includes the first photoelectric conversion portion 101A and the second photoelectric conversion portion 102A, and the second pixel 100B which includes a first photoelectric conversion portion 101B and a second photoelectric conversion portion 102B. Light collected by a first microlens is incident on the first photoelectric conversion portion 101A and the second photoelectric conversion portion 102A included in the first pixel 100A. Light collected by a second microlens is incident on the first photoelectric conversion portion 101B and the second photoelectric conversion portion 102B included in the second pixel 100B.

The first transfer transistors 103A and 103B and the second transfer transistors 104A and 104B are provided respectively for the first photoelectric conversion portions 101A and 101B and the second photoelectric conversion portions 102A and 102B. The driving lines 211A, 211B, 212A, and 212B are provided respectively for the first transfer transistors 103A and 103B and the second transfer transistors 104A and 104B, as lines that respectively supply driving pulses to the first transfer transistors 103A and 103B and the second transfer transistors 104A and 104B.

Such a configuration allows a plurality of pixels for imaging capturing to share the amplifying portion 201, the reset transistor 202, and the selection transistor 203. The sharing of components can reduce the number of transistors per pixel and consequently allows larger areas for the photoelectric conversion portions.

The structure of the imaging device according to the first exemplary embodiment in plan view will be described next. FIG. 3 is a plan view schematically illustrating a structure of the imaging device illustrated in FIG. 2. In FIG. 3, components corresponding to the components illustrated in FIG. 2 are denoted by the same reference numerals used in FIG. 2.

The imaging device is formed on a semiconductor substrate, for example, a silicon substrate. The semiconductor substrate includes a plurality of active regions. The first photoelectric conversion portion 101A and the second photoelectric conversion portion 102A included in the first pixel 100A are disposed in a first active region 301. The first photoelectric conversion portion 101B and the second photoelectric conversion portion 102B included in the second pixel 100B are disposed in a second active region 302 different from the first active region 301. The first photoelectric conversion portion 101A includes a first semiconductor region of n-type in which a signal charge accumulates. The second photoelectric conversion portion 102A includes a second semiconductor region of n-type in which a signal charge accumulates. The first and second semiconductor regions have areas which are substantially equal to each other in plan view.

The first photoelectric conversion portion 101A and the second photoelectric conversion portion 102A are disposed so as to be substantially conjugate to the pupil of the lens. The first photoelectric conversion portion 101A and the second photoelectric conversion portion 102A receive rays that have passed through different positions of the pupil of the lens. This configuration enables focus detection. An imaging device for focus detection is one of a plurality of embodiments. In other embodiments of the present invention, operations for reading out individual signals and reading out an added signal from the two photoelectric conversion portions may be performed for other usages.

The first active region 301 includes the first FD region 107A and the second FD region 108A. A charge in the first photoelectric conversion portion 101A is transferred to the first FD region 107A. A charge in the second photoelectric conversion portion 102A is transferred to the second FD region 108A. The first FD region 107A and the second FD region 108A are electrically connected to each other via contact plugs and the conductive member 109A. The first FD region 107A, the second FD region 108A, and the conductive member 109A form the FD portion 110. A figure denoted by the reference numeral 250 represents a contact plug. All the identical figures represent contact plugs; however, illustration of the reference numeral for the other contact plugs is omitted in order to simplify the drawing.

Referring to FIG. 3, gate electrodes of the individual transistors are denoted by the same reference numerals as those for the corresponding transistors illustrated in FIG. 2. For example, the gate electrode denoted by 103A is the gate of the first transfer transistor 103A illustrated in FIG. 2. The same applies to the other gate electrodes.

As illustrated in FIG. 3, the gate electrode of the first transfer transistor 103A is disposed between the first photoelectric conversion portion 101A and the first FD region 107A in plan view. In addition, the gate electrode of the second transfer transistor 104A is disposed between the second photoelectric conversion portion 102A and the second FD region 108A in plan view.

The amplifying portion (hereinafter, also referred to as "amplifying transistor") 201, the reset transistor 202, and the selection transistor 203 are disposed in a third active region 303 different from the first active region 301 and the second active region 302 in which the first photoelectric conversion portion 101A and the second photoelectric conversion portion 102A are respectively disposed. Each of these transistors shares a source or drain region with another transistor. Specifically, a drain region shared by the amplifying transistor 201 and the reset transistor 202 is electrically connected via a contact plug to a conductive member 206 which supplies a power source voltage. A source region of the selection transistor 203 is electrically connected via a contact plug to a conductive member that serves as the output line 207.

In addition, the FD portion 110 is electrically connected to the gate electrode of the amplifying transistor 201 via a contact plug. Specifically, the conductive member 109A that electrically connects the first FD region 107A and the second FD region 108A to each other is electrically connected to the gate electrode of the amplifying transistor 201 via a contact plug. Likewise, a first FD region 107B and a second FD region 108B of the second pixel 100B are also electrically connected to the gate electrode of the amplifying transistor 201 via a conductive member (not illustrated) and contact plugs (not illustrated).

The gate electrode of the first transfer transistor 103A is electrically connected via a contact plug to a first conductive member 105A that serves as the corresponding driving line 211A. The gate electrode of the second transfer transistor 104A is electrically connected via a contact plug to a second conductive member 106A that serves as the corresponding driving line 212A. The gate electrode of the reset transistor 202 is electrically connected via a contact plug to a conductive member 204 that serves as the corresponding driving line 209. The gate electrode of the selection transistor 203 is electrically connected via a contact plug to a conductive member 205 that serves as the corresponding driving line 210.

In the first exemplary embodiment, the first conductive members 105A and 105B, the second conductive members 106A and 106B, and the conductive members 109A, 109B, 204, and 205 are disposed on the same wiring layer; however, any of these conductive members may be disposed on another wiring layer. A wiring layer not illustrated in FIG. 3 includes conductive members that serve as the output line 207, a power source wiring, and a light-shielding wiring, for example.

As illustrated in FIG. 3, in the first exemplary embodiment, at least part of an orthogonal projection of the second conductive member 106A onto a predetermined plane is located between an orthogonal projection of the first conductive member 105A onto the predetermined plane and an orthogonal projection of the first FD region 107A or the second FD region 108A included in the FD portion 110 onto the predetermined plane. The predetermined plane is, for example, a plane that is parallel to an interface between the semiconductor substrate and an insulating film disposed on the semiconductor substrate.

In a modification, at least part of an orthogonal projection of the first conductive member 105A onto a predetermined plane is located between an orthogonal projection of the second conductive member 106A onto the predetermined plane and an orthogonal projection of the first FD region 107A or the second FD region 108A included in the FD portion 110 onto the predetermined plane. That is, the positions of the first conductive member 105A and the second conductive member 106A in FIG. 3 are changed.

Such a structure makes a capacitance component between the first conductive member 105A and the FD portion 110 smaller than a capacitance component between the second conductive member 106A and the FD portion 110. Specifically, in the first exemplary embodiment, a distance over which the first conductive member 105A, the second conductive member 106A, and the FD portion 110 extend along one another is about 2.4 micrometers, and a space between wirings of the first conductive member 105A and the second conductive member 106A is about 0.3 micrometers. In such a case, the capacitance component between the first conductive member 105A and the FD portion 110 is approximately half the capacitance component between the second conductive member 106A and the FD portion 110. A ratio of the total capacitance component between the first conductive member 105A and the second conductive member 106A to the total capacitance of the FD portion 110 is about 20%. Note that the aforementioned numerical values are merely examples and can be changed as appropriate.

In the first exemplary embodiment, the first photoelectric conversion portion 101A, the gate electrode of the first transfer transistor 103A, and the first FD region 107A are arranged along a channel direction of the first transfer transistor 103A (i.e., along a first direction in FIG. 3). In addition, the second photoelectric conversion portion 102A, the gate electrode of the second transfer transistor 104A, and the second FD region 108A are arranged along a channel direction of the second transfer transistor 104A (i.e., along a third direction in FIG. 3). The first conductive member 105A and the second conductive member 106A extend along a direction crossing these channel directions (i.e., along a second direction in FIG. 3). Such an arrangement enables an efficient arrangement of driving lines for the transfer transistors, leading to larger openings above the photoelectric conversion portions. As a result, the first exemplary embodiment can improve the sensitivity.

In the first exemplary embodiment, an orthogonal projection of the gate electrode of the first transfer transistor 103A onto a predetermined plane is at least partially superimposed with orthogonal projections of the first conductive member 105A and the second conductive member 106A onto the predetermined plane. In addition, an orthogonal projection of the gate electrode of the second transfer transistor 104A onto a predetermined plane is at least partially superimposed with orthogonal projections of the first conductive member 105A and the second conductive member 106A onto the predetermined plane. Such an arrangement enables an efficient arrangement of driving lines for the transfer transistors, leading to larger openings above the photoelectric conversion portions. As a result, the first exemplary embodiment can improve the sensitivity.

Now, how the imaging device according to the first exemplary embodiment is driven will be described with reference to driving pulses illustrated in FIG. 4. An operation of the imaging device illustrated in FIG. 1 will be described. For each driving pulse, the corresponding transistor is switched on when the driving pulse is at a high level and is switched off when the driving pulse is at a low level.

At time t1, driving pulses PTXA and PTXB respectively supplied to the driving lines 211A and 212A are switched to the high level. At this time, a driving pulse PRES supplied to the driving line 209 is at the high level. Accordingly, the first photoelectric conversion portion 101A and the second photoelectric conversion portion 102A are reset.

At time t2, the driving pulses PTXA and PTXB are switched to the low level. At this timing, the first photoelectric conversion portion 101A and the second photoelectric conversion portion 102A start accumulating a charge. Because the driving pulse PRES is maintained at the high level, the operation for resetting the FD portion 110 which serves as the input node of the amplifying portion 201 is continued.

At time t3, a driving pulse PSEL supplied to the driving line 210 for the selection transistor 203 is switched to the high level, switching on the selection transistor 203. This consequently causes a signal based on a voltage at the FD portion 110, that is, a signal based on a voltage at the input node of the amplifying portion 201, to be output to the output line 207.

At time t4, the driving pulse PRES supplied to the driving line 209 for the reset transistor 202 is switched to the low level to stop the operation for resetting the input node of the amplifying portion 201. At this time, a signal based on a reset state of the FD portion 110 (hereinafter, referred to as a reset level signal) is output. The reset level signal output to the output line 207 is input to the column circuit 113. At this time, the operational amplifier 119 of the column circuit 113 is in a virtually grounded state. Specifically, the driving pulse PCOR is at the high level, and the switch 118 is in the conducting state. The operational amplifier 119 is buffering an output of the reference voltage Vref. In this state, the input capacitor 116 is supplied with the reset level signal.

At time t5, the driving pulse PCOR is switched to the low level. At time t6, the driving pulse PTN is switched from the low level to the high level to switch on the switches 126 and 128. At time t7, the driving pulse PTN is switched from the high level to the low level to switch off the switches 126 and 128. This operation causes an output substantially equal to the reference voltage Vref to be held by the holding capacitors 122 and 124 as the reset level signal.

At time t8, the driving pulse PTXA is switched to the high level. At time t9, the driving pulse PTXA is switched to the low level. This operation causes a charge in the first photoelectric conversion portion 101A to be transferred to the FD portion 110. Consequently, a first signal based on the charge generated by the first photoelectric conversion portion 101A is supplied to the column circuit 113 via the amplifying portion 201 and the output line 207. The first signal can be used for focus detection.

Because the driving pulse PTXB is maintained at the low level from time t8 to time t9, the second transfer transistor 104A is switched off. Specifically, at time t8, the first transfer transistor 103A is switched on while keeping the second transfer transistor 104A switched off, from the state where both the first transfer transistor 103A and the second transfer transistor 104A are switched off.

The column circuit 113 outputs a value obtained by multiplying a change in voltage by an inverting gain which is a ratio between a capacitance value C0 of the input capacitor 116 and a capacitance value Cf of the feedback capacitor 117. Here, let ΔVa (a negative value) denote a change in voltage at the output line 207. Then, an output voltage V(A) of the operational amplifier 119 is denoted by Equation (1).

$$V(A) = Vref + \Delta Va \times (-C0/Cf) \quad \text{Equation (1)}$$

At time t10, the driving pulse PTSA is switched from the low level to the high level to switch on the switch 125. At time t11, the driving pulse PTSA is switched from the high level to the low level to switch off the switch 125. This operation causes the output voltage V(A) of the operational amplifier 119 to be held in the holding capacitor 121. The signal held by the holding capacitor 121 corresponds to the first signal output from the first photoelectric conversion portion 101A for focus detection.

At time t12, the driving pulse PTXA is switched to the high level. The driving pulse PTXB is switched to the high level for at least a period within a period for which the driving pulse PTXA is at the high level. This consequently switches on both the first transfer transistor 103A and the second transfer transistor 104A. This operation allows charges in both the first photoelectric conversion portion 101A and the second photoelectric conversion portion 102A to be simultaneously transferred to the FD portion 110. Note that the driving pulses PTXA and PTXB may be simultaneously switched from the low level to the high level. Alternatively, the driving pulse PTXA may be switched from the low level to the high level before or after the driving pulse PTXB is switched from the low level to the high level.

The operation from time t12 to time t13 enables generation of an image formation signal at the output line 207. The image formation signal at the output line 207 is supplied to the column circuit 113. Let ΔVa+b (a negative value) denote a change in voltage at the output line 207. Then, an output voltage V(A+B) of the operational amplifier 119 is denoted by Equation (2).

$$V(A+B)=V\text{ref}+\Delta Va+b\times(-C0/Cf) \quad \text{Equation (2)}$$

At time t14, the driving pulse PTS(A+B) is switched from the low level to the high level to switch on the switch 127. At time t15, the driving pulse PTS(A+B) is switched from the high level to the low level to switch off the switch 127. This operation causes the voltage V(A+B) at the output node of the operational amplifier 119 to be held in the holding capacitor 123. The signal held by the holding capacitor 123 corresponds to the image formation signal.

At time t16, the driving pulse PRES is switched to the high level. This consequently switches on the reset transistor 202, and the voltage at the FD portion 110 is reset.

The switches 129 to 132 sequentially conduct in synchronization with a pulse PH at and after time t17. This causes the signals held by the holding capacitors 121 to 124 to be sequentially read out to the horizontal output lines 139 and 140.

An image formation signal for one pixel is obtained based on a difference between voltages at the holding capacitors 123 and 124. The difference is denoted by Equation (3).

$$V(A+B)-V\text{ref}=\Delta Va+b\times(-C0/Cf) \quad \text{Equation (3)}$$

In addition, a signal of the first photoelectric conversion portion 101A alone is obtained based on a difference between voltages at the holding capacitors 121 and 122. The difference is denoted by Equation (4).

$$V(A)-V\text{ref}=\Delta Va\times(-C0/Cf) \quad \text{Equation (4)}$$

Further, a signal of the second photoelectric conversion portion 102A alone is obtained based on a difference between voltages at the holding capacitors 121 and 123. The difference is denoted by Equation (5).

$$V(A+B)-V(A)=(\Delta Va+b-\Delta Va)\times(-C0/Cf) \quad \text{Equation (5)}$$

The calculations described above can be performed by the imaging device or by a signal processor after the signals are output from the imaging device. However, the signal of the first photoelectric conversion portion 101A alone and the added signal of the signals of the first photoelectric conversion portion 101A and the second photoelectric conversion portion 102A are obtained by the imaging device.

According to the first exemplary embodiment, the imaging device includes the output amplifier 115 capable of performing subtraction processing at downstream of the horizontal output lines 139 and 140. This configuration allows a differential signal of the signals held by the holding capacitors 121 and 122 and a differential signal of the signals held by the holding capacitors 123 and 124 to be output to outside the imaging device. In this way, noise caused at the horizontal output lines 139 and 140 can be reduced. However, the output amplifier 115 need not be configured to obtain a differential output and may be a simple buffering stage.

Figure 4:
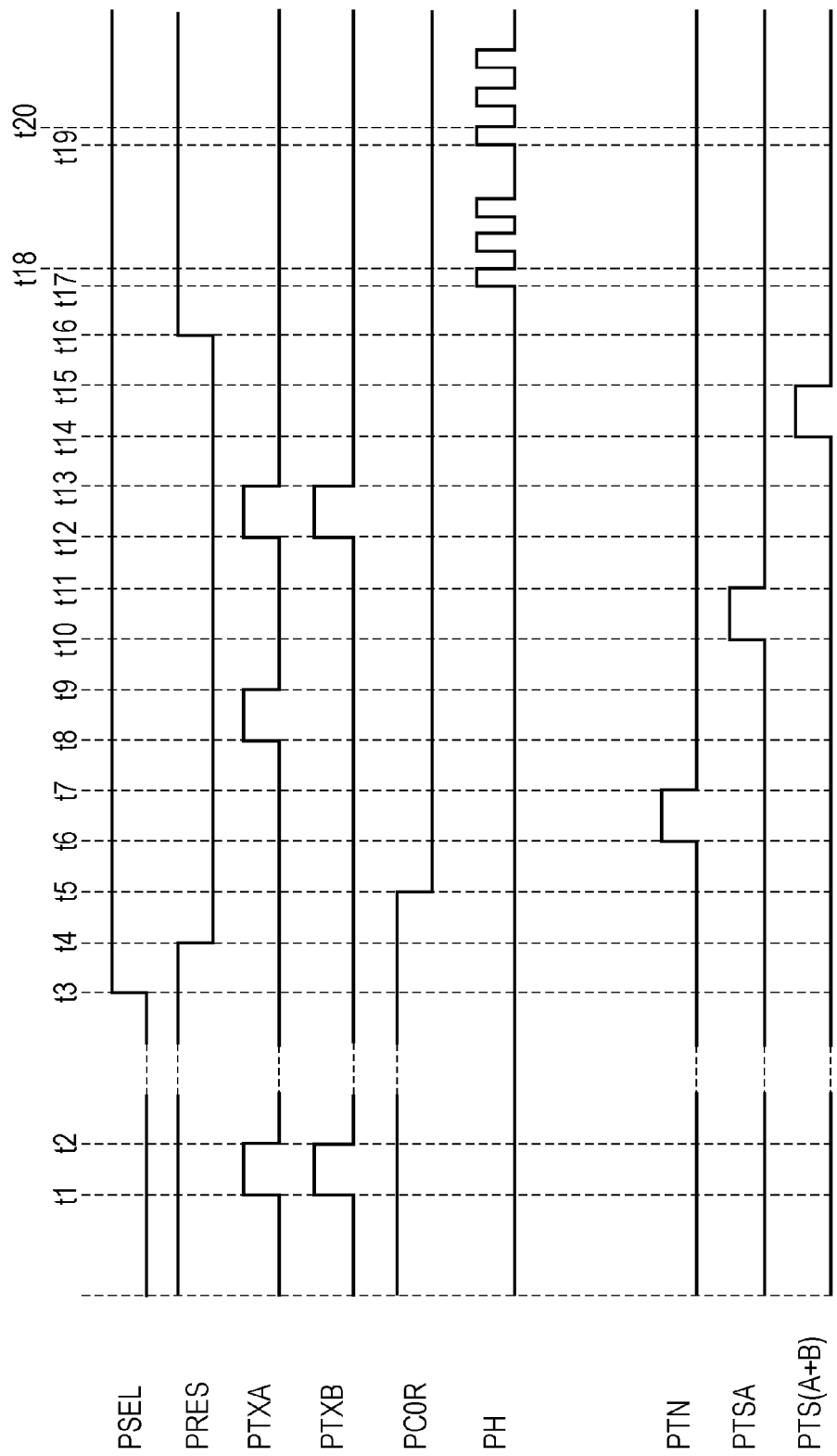
FIG. 4 is a chart illustrating driving timings of the imaging device.

According to the driving method illustrated in FIG. 4, a second control operation is performed with at least part of a signal charge that has been transferred to the FD portion 110 by a first control operation being held in the FD portion 110. Specifically, the voltage at the FD portion 110, that is, the voltage at the input node of the amplifying portion 201 is not reset from when the charge in the first photoelectric conversion portion 101A is transferred to when the charges in the first photoelectric conversion portion 101A and the second photoelectric conversion portion 102B are simultaneously transferred to the FD portion 110. That is, the reset transistor 202 is switched off from when a first transfer transistor 103 is switched on to when both the first transfer transistor 103 and a second transfer transistor 104 are switched on.

In a modification, the reset transistor 202 may be switched on in a period from time t11 to time t12, for example. In such a modification, the first signal output from the first photoelectric conversion portion 101A for focus detection and a second signal output from the second photoelectric conversion portion 102A for focus detection are separately obtained. An image formation signal can be obtained by adding the first and second signals for focus detection together.

The operation of the imaging device illustrated in FIG. 1 has been described above. In an operation of the imaging device illustrated in FIG. 2, signals are read out at driving timings similar to those illustrated in FIG. 4. The imaging device illustrated in FIG. 2 is capable of reading out signals from the first photoelectric conversion portion 101A and the second photoelectric conversion portion 102A and signals from the first photoelectric conversion portion 101B and the second photoelectric conversion portion 102B as signals of different rows.

Specifically, in the first pixel 100A, the signal of the first photoelectric conversion portion 101A is read out, and then charges in the first photoelectric conversion portion 101A and the second photoelectric conversion portion 102A are added together at the FD portion 110. In this way, a focus detection signal and an imaging signal can be generated. In the second pixel 100B, the signal of the first photoelectric conversion portion 101B is read out, and then charges in the first photoelectric conversion portion 101B and the second photoelectric conversion portion 102B are added together at the FD portion 110. In this way, a focus detection signal and an imaging signal can be generated.

In addition, two different pixels share the amplifying portion 201 in the imaging device illustrated in FIG. 2. Accordingly, charges in the first photoelectric conversion portions 101A and 101B may be added together at the FD portion 110, and charges in the second photoelectric conversion portions 102A and 102B may be added together at the FD portion 110.

FIG. 5 illustrates an example of driving timings in the case where signals of two pixels are added together before being read out. It is assumed here that a driving pulse PTXA (103A) is supplied to the first transfer transistor 103A and a driving pulse PTXB (104A) is supplied to the second transfer transistor 104A. It is also assumed that a driving pulse PTXA (103B) is supplied to the first transfer transistor 103B and a driving pulse PTXB (104B) is supplied to the second transfer transistor 104B.

At time t8, the driving pulses PTXA (103A) and PTXA (103B) are switched from the low level to the high level.

Then, at time t9, the driving pulses PTXA (103A) and PTXA (103B) are switched from the high level to the low level. By this operation, charges in the first photoelectric conversion portions 101A and 101B included in different pixels are added together at the FD portion 110. The resulting signal is used as a focus detection signal.

At time t12, the driving pulses PTXA (103A), PTXB (104A), PTXA (103B), and PTXB (104B) are switched from the low level to the high level. Then, at time t13, the driving pulses PTXA (103A), PTXB (104A), PTXA (103B), and PTXB (104B) are switched from the high level to the low level. By this operation, charges in the first photoelectric conversion portions 101A and 101B and the second photoelectric conversion portions 102A and 102B included in different pixels are added together at the FD portion 110. The resulting signal is used as an imaging signal.

By the above-described operation, a focus detection signal is obtained by adding charges in a plurality of photoelectric conversion portions included in different pixels. This configuration thus improves a signal-to-noise ratio and consequently enables highly accurate focus detection.

In the imaging device according to the first exemplary embodiment, a potential at a first photoelectric conversion portion 101 for a signal charge is higher than a potential at a second photoelectric conversion portion 102 for the signal charge. Because electrons serve as the signal charge, a voltage at the first photoelectric conversion portion 101 in a depleted state is lower than a voltage at the second photoelectric conversion portion 102 in the depleted state. In the first exemplary embodiment, in order to attain such a potential state, the first photoelectric conversion portion 101 and the second photoelectric conversion portion 102 respectively include a first semiconductor region of n-type and a second semiconductor region of n-type, and the first semiconductor region has a lower impurity concentration than the second semiconductor region.

FIGS. 6A and 6B schematically illustrate a potential in a pixel of the imaging device. The vertical axis represents the potential for a signal charge, and the horizontal axis represents a position on the semiconductor substrate. FIG. 6A illustrates the case (comparative example) where the potential at the first photoelectric conversion portion 101A is equal to the potential at the second photoelectric conversion portion 102A. FIG. 6B illustrates the potential according to the first exemplary embodiment.

Figures on the left in FIGS. 6A and 6B illustrate the potential on a cross-section taken along line A1-A2 illustrated in FIG. 3. Specifically, the figures illustrate the potential at the first photoelectric conversion portion 101A, at a semiconductor region below the gate electrode of the first transfer transistor 103A, and at the first FD region 107A. The figures on the left in FIGS. 6A and 6B illustrate the potential when the first transfer transistor 103A is switched on and the second transfer transistor 104A is switched off.

Figures on the right in FIGS. 6A and 6B illustrate the potential on a cross-section taken along line B1-B2 illustrated in FIG. 3. Specifically, the figures illustrate the potential at the second photoelectric conversion portion 102A, at a semiconductor region below the gate electrode of the second transfer transistor 104A, and at the second FD region 108A. The figures on the right in FIGS. 6A and 6B illustrate the potential when both the first transfer transistor 103A and the second transfer transistor 104A are switched on.

As illustrated in FIG. 6A, in the comparative example, the potential at the first photoelectric conversion portion 101A in the depleted state is equal to the potential at the second photoelectric conversion portion 102A in the depleted state. A voltage at a photoelectric conversion portion when the entire semiconductor region of the photoelectric conversion portion in which a signal charge accumulates is in the depleted state is referred to as a depletion voltage Vdep.

When the voltage at the gate of the transfer transistor changes from the low level to the high level, the potential at the FD portion 110 changes due to capacitive coupling between the gate electrode of the transfer transistor and the FD portion 110. Referring to FIGS. 6A and 6B, comparison of the potentials at the first FD region 107A and the second FD region 108A indicates that the potential at the first FD region 107A is higher than the potential at the second FD region 108A by $\Delta V1$. This is because capacitive coupling between the FD portion 110 and the gate electrodes of the first transfer transistor 103A and the second transfer transistor 104A is larger than capacitive coupling between the FD portion 110 and the gate electrode of the first transfer transistor 103A. That is, the potential at the FD portion 110 becomes lower when both the first transfer transistor 103A and the second transfer transistor 104A are switched on than when only the first transfer transistor 103A is switched on.

This potential change at the FD portion 110 influences the potential at the semiconductor region below the gate electrode of the transfer transistor. Specifically, as the potential at the FD portion 110 becomes lower, the potential at the semiconductor region below the gate electrode of the transfer transistor becomes lower.

The saturation charge quantity can be increased by setting depletion voltages Vdep of the first photoelectric conversion portion 101A and the second photoelectric conversion portion 102A so as to substantially remove a potential barrier in the semiconductor region below the gate electrode when both the first transfer transistor 103A and the second transfer transistor 104A are switched on.

In the comparative example, however, the potential at the first photoelectric conversion portion 101A is equal to the potential at the second photoelectric conversion portion 102A. Accordingly, in the comparative example as illustrated in FIG. 6A, a potential barrier can be caused between the first photoelectric conversion portion 101A and the first FD region 107A when the first transfer transistor 103A alone is switched on because the potential at the FD portion 110 is relatively high. This potential barrier can cause a residual charge.

In contrast, in the first exemplary embodiment as illustrated in FIG. 6B, the potential at the first photoelectric conversion portion 101A is higher than the potential at the second photoelectric conversion portion 102A by approximately $\Delta V2$. Accordingly, a potential barrier is less likely to be caused between the first photoelectric conversion portion 101A and the first FD region 107A when the first transfer transistor 103A alone is switched on. Accordingly, the amount of residual charge can be reduced or made zero.

As described above, the first exemplary embodiment can achieve an improved saturation charge quantity of a pixel and reduce the amount of residual charge.

Referring to FIGS. 6A and 6B, the gate electrodes of the first transfer transistor 103A and the second transfer transistor 104A are supplied with a control signal having an equal voltage when the first transfer transistor 103A and the second transfer transistor 104A are switched on. When the first transfer transistor 103A alone is switched on, the gate electrode of the first transfer transistor 103A may be supplied with a control signal having a voltage amplitude larger than that used in the case where both the first transfer transistor 103A and the second transfer transistor 104A are switched on. In the case where electrons serve as a signal charge, the higher the voltage applied to the gate of the transfer transistor becomes, the lower the potential at the semiconductor region below the gate electrode of the transfer transistor becomes. For this reason, such a configuration can reduce the amount of residual charge more.

The first exemplary embodiment also provides the following side benefits. In general, the voltage at the FD portion can change due to capacitive coupling between the FD portion and the conductive member electrically connected to the gate of the transfer transistor, when the voltage at the gate of the transfer transistor shifts from an off-level to an on-level. Accordingly, the accuracy of a signal based on the transferred charge can be increased by reading the signal after the change in the voltage at the FD portion has sufficiently converged, that is, the voltage at the FD portion has become stable. However, if the change in the voltage at the FD portion is large, it may take some time for the voltage at the FD portion to become stable. As a result, it may take long to read a correct signal.

In the first exemplary embodiment, a signal based on a charge in the first photoelectric conversion portion 101A among the two photoelectric conversion portions is read out independently. To do this, control is performed to switch the first transfer transistor 103A from off to on while keeping the second transfer transistor 104A switched off, among the first transfer transistor 103A and the second transfer transistor 104A. In addition, in the first exemplary embodiment, capacitive coupling between the FD portion 110 and the gate electrode of the first transfer transistor 103A is small. Such a configuration can reduce a change in the voltage at the FD portion 110 and consequently reduces a time taken from transfer of a charge to readout of a signal, enabling high-speed signal readout. Making a change in the voltage at the FD portion 110 smaller, however, increases the possibility of the residual charge occurring. In such a configuration, the benefit of reducing the amount of residual charge is markedly obtained with the first exemplary embodiment.

Now, a potential barrier in the vicinity of the photoelectric conversion portions in the first exemplary embodiment will be described. A potential barrier between the first photoelectric conversion portion 101A and the second photoelectric conversion portion 102A is lower than a potential barrier between the first photoelectric conversion portion 101A and a photoelectric conversion portion of another pixel. Such a configuration allows a signal charge to accumulate in the second photoelectric conversion portion 102A of the same pixel if the first photoelectric conversion portion 101A is saturated, which consequently can reduce color mixing. A relatively high potential at the first photoelectric conversion portion 101A tends to make the saturation charge quantity of the first photoelectric conversion portion 101A smaller. Accordingly, the aforementioned benefit of reducing color mixing is markedly obtained.

Figure 7A:
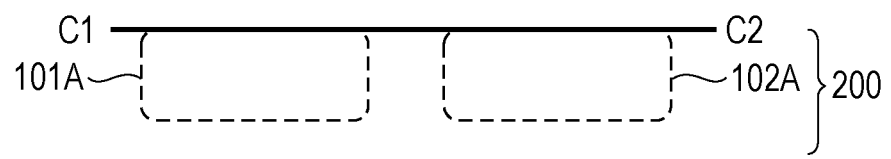
FIGS. 7A to 7C are diagrams schematically illustrating a cross-sectional structure of the imaging device.
Figure 7B:
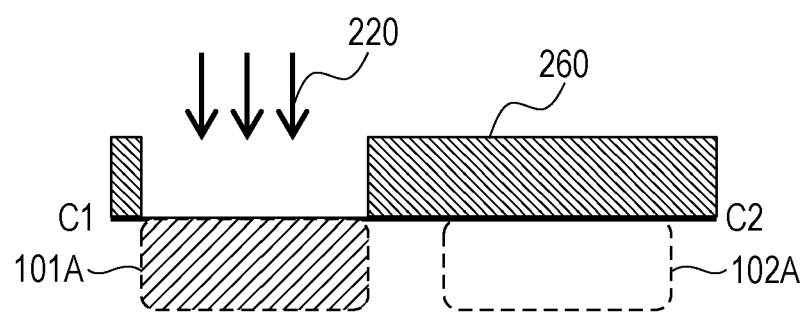
Figure 7C:
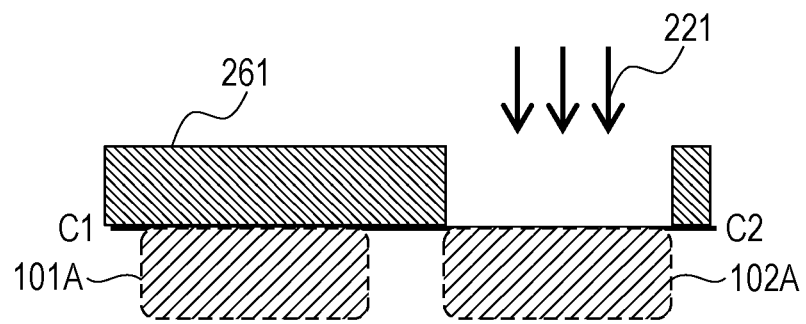

Now, a fabrication method for forming the first photoelectric conversion portion 101A and the second photoelectric conversion portion 102A according to the first exemplary embodiment will be described. FIGS. 7A to 7C schematically illustrate a cross-section taken along line C1-C2 illustrated in FIG. 3. FIGS. 7A to 7C illustrate the cross-section in respective steps of the fabrication method.

First, a semiconductor substrate 200 is prepared. Referring to FIG. 7A, regions where the first photoelectric conversion portion 101A and the second photoelectric conversion portion 102A are to be formed are indicated by dashed lines.

In a step illustrated in FIG. 7B, a mask pattern 260 is disposed. The mask pattern 260 has an opening at a region where the first photoelectric conversion portion 101A is to be formed. The mask pattern 260 is disposed over the region where the second photoelectric conversion portion 102A is to be formed. The mask pattern 260 is obtained by patterning a photoresist by photolithography, for example.

Then, the semiconductor substrate 200 is doped with an n-type impurity 220 by ion implantation using the mask pattern 260. In this way, the first semiconductor region in which a signal charge in the first photoelectric conversion portion 101A accumulates is formed. After the ion implantation, the mask pattern 260 is removed.

In a step illustrated in FIG. 7C, a mask pattern 261 is disposed. The mask pattern 261 has an opening at a region where the second photoelectric conversion portion 102A is to be formed. The mask pattern 261 is disposed over the region where the first photoelectric conversion portion 101A is formed. The mask pattern 261 is obtained by patterning a photoresist by photolithography, for example.

The semiconductor substrate 200 is doped with an n-type impurity 221 by ion implantation using the mask pattern 261. In this way, the second semiconductor region that accumulates a signal charge in the second photoelectric conversion portion 102A is formed. After the ion implantation, the mask pattern 261 is removed.

According to the fabrication method illustrated in FIGS. 7A to 7C A, a dose of the n-type impurity 220 is made less than a dose of the n-type impurity 221. Accordingly, an impurity concentration of the first semiconductor region in which a signal charge in the first photoelectric conversion portion 101A accumulates is lower than an impurity concentration of the second semiconductor region in which a signal charge in the second photoelectric conversion portion 102A accumulates. This configuration can consequently make the potential at the first photoelectric conversion portion 101A higher than the potential at the second photoelectric conversion portion 102A.

With the fabrication method including the above-described steps, the first photoelectric conversion portion 101A and the second photoelectric conversion portion 102A can be formed. Note that the steps illustrated FIGS. 7B and 7C may be performed in the opposite order.

Figure 8A:
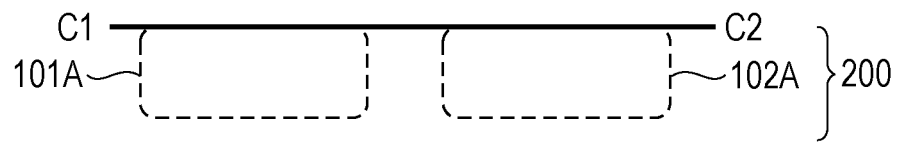
FIGS. 8A to 8C are diagrams schematically illustrating a cross-sectional structure of the imaging device.
Figure 8B:
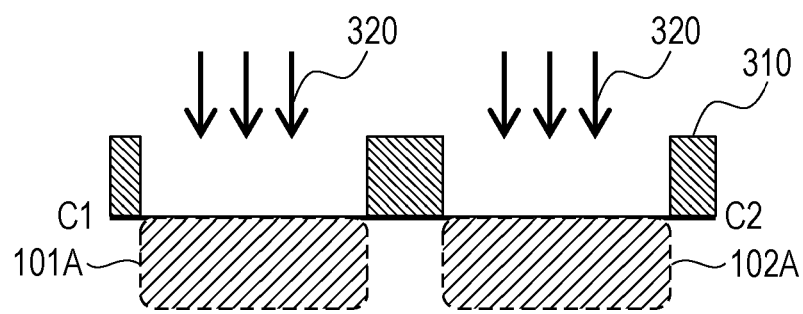
Figure 8C:
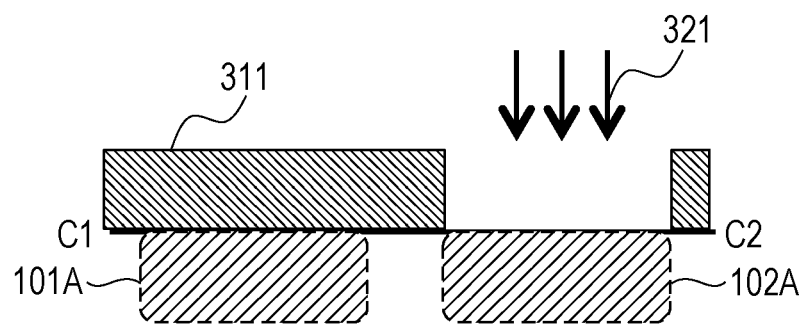

Another fabrication method for forming the first photoelectric conversion portion 101A and the second photoelectric conversion portion 102A according to the first exemplary embodiment will be described. FIGS. 8A to 8C schematically illustrate a cross-section taken along line C1-C2 illustrated in FIG. 3. FIGS. 8A to 8C illustrate the cross-section in respective steps of the fabrication method.

First, the semiconductor substrate 200 is prepared. Referring to FIG. 8A, regions where the first photoelectric conversion portion 101A and the second photoelectric conversion portion 102A are to be formed are indicated by dashed lines.

In a step illustrated in FIG. 8B, a mask pattern 310 is disposed. The mask pattern 310 has an opening at a region where the first photoelectric conversion portion 101A is to be formed and an opening at a region where the second photoelectric conversion portion 102A is to be formed. The mask pattern 310 is obtained by patterning a photoresist by photolithography, for example.

The semiconductor substrate 200 is doped with an n-type impurity 320 by ion implantation using the mask pattern 310. In this way, the first semiconductor region in which a signal charge in the first photoelectric conversion portion 101A accumulates and the second semiconductor region in which a signal charge in the second photoelectric conversion portion 102A accumulates are formed. After the ion implantation, the mask pattern 310 is removed.

In a step illustrated in FIG. 8C, a mask pattern 311 is disposed. The mask pattern 311 has an opening at the region where the second photoelectric conversion portion 102A is to be formed. The mask pattern 311 is disposed over the region where the first photoelectric conversion portion 101A is formed. The mask pattern 311 is obtained by patterning a photoresist by photolithography, for example.

The semiconductor substrate 200 is doped with an n-type impurity 321 by ion implantation using the mask pattern 311. In this way, the second semiconductor region in which a signal charge in the second photoelectric conversion portion 102A accumulates comes to have a higher impurity concentration. After the ion implantation, the mask pattern 311 is removed.

The fabrication method illustrated in FIGS. 8A to 8C includes a step of implanting an impurity at both the first photoelectric conversion portion 101A and the second photoelectric conversion portion 102A and a step of implanting an impurity only at the second photoelectric conversion portion 102A. Accordingly, an impurity concentration of the first semiconductor region in which a signal charge in the first photoelectric conversion portion 101A accumulates is lower than an impurity concentration of the second semiconductor region in which a signal charge in the second photoelectric conversion portion 102A accumulates. This configuration can consequently make the potential at the first photoelectric conversion portion 101A higher than the potential at the second photoelectric conversion portion 102A.

With the fabrication method including the above-described steps, the first photoelectric conversion portion 101A and the second photoelectric conversion portion 102A can be formed. Note that the steps illustrated FIGS. 8B and 8C may be performed in the opposite order.

Another fabrication method for forming the first photoelectric conversion portion 101A and the second photoelectric conversion portion 102A according to the first exemplary embodiment will be described. FIGS. 9A to 9D schematically illustrate a cross-section taken along line C1-C2 illustrated in FIG. 3. FIGS. 9A to 9D illustrate the cross-section in respective steps of the fabrication method.

In the example described in FIGS. 9A to 9D, the first photoelectric conversion portion 101A includes a first semiconductor region 151A in which a signal charge accumulates and a third semiconductor region 153A disposed above the first semiconductor region 151A. The first semiconductor region 151A and the third semiconductor region 153A have an identical conductivity type. The third semiconductor region 153A extends along a direction parallel to the surface of the semiconductor substrate 200. A length of the third semiconductor region 153A along the direction parallel to the surface of the semiconductor substrate 200 is larger than a length of the first semiconductor region 151A along the direction. That is, on a cross-section of the semiconductor substrate 200, for example, on the cross-section illustrated in FIG. 9D, a width of the third semiconductor region 153A is larger than a width of the first semiconductor region 151A.

In addition, the second photoelectric conversion portion 102A includes a second semiconductor region 152A in which a signal charge accumulates and a fourth semiconductor region 154A disposed above the second semiconductor region 152A. The second semiconductor region 152A and the fourth semiconductor region 154A have an identical conductivity type. The fourth semiconductor region 154A extends along a direction parallel to the surface of the semiconductor substrate 200. A length of the fourth semiconductor region 154A along the direction parallel to the surface of the semiconductor substrate 200 is larger than a length of the second semiconductor region 152A along the direction. That is, on a cross-section of the semiconductor substrate 200, for example, on the cross-section illustrated in FIG. 9D, a width of the fourth semiconductor region 154A is larger than a width of the second semiconductor region 152A.

Figure 9A:
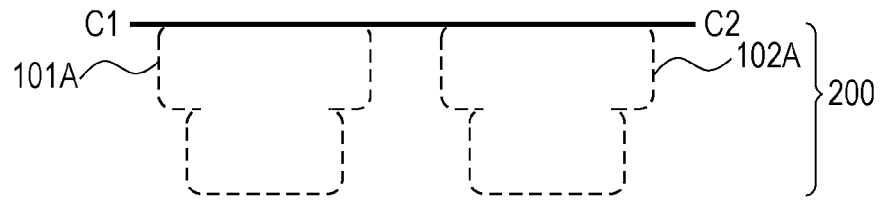
FIGS. 9A to 9D are diagrams schematically illustrating a cross-sectional structure of the imaging device.

First, the semiconductor substrate 200 is prepared. Referring to FIG. 9A, regions where the first photoelectric conversion portion 101A and the second photoelectric conversion portion 102A are to be formed are indicated by dashed lines.

Figure 9B:
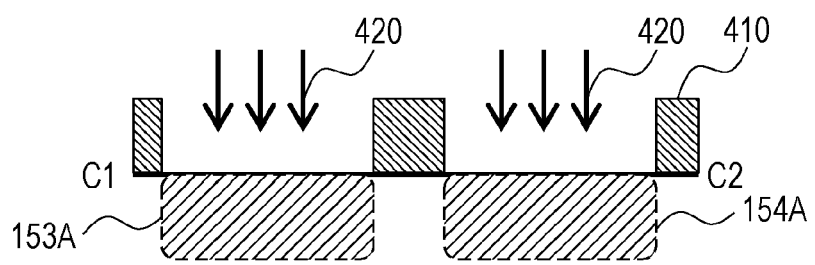

In a step illustrated in FIG. 9B, a mask pattern 410 is disposed. The mask pattern 410 has an opening at a region where the first photoelectric conversion portion 101A is to be formed and an opening at a region where the second photoelectric conversion portion 102A is to be formed. The mask pattern 410 is obtained by patterning a photoresist by photolithography, for example.

The semiconductor substrate 200 is doped with an n-type impurity 420 by ion implantation using the mask pattern 410. In this way, the third semiconductor region 153A and the fourth semiconductor region 154A are formed. After the ion implantation, the mask pattern 410 is removed.

Figure 9C:
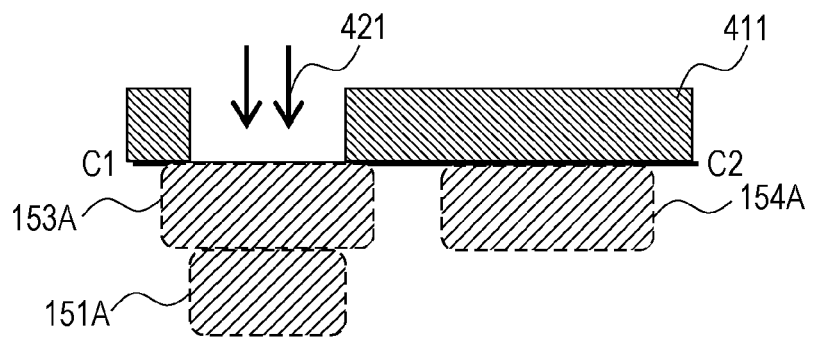

In a step illustrated in FIG. 9C, a mask pattern 411 is disposed. The mask pattern 411 has an opening at a region where the first photoelectric conversion portion 101A is to be formed. The mask pattern 411 is disposed over the region where the second photoelectric conversion portion 102A is to be formed. The mask pattern 411 is obtained by patterning a photoresist by photolithography, for example.

The semiconductor substrate 200 is doped with an n-type impurity 421 by ion implantation using the mask pattern 411. In this way, the first semiconductor region 151A in which a signal charge in the first photoelectric conversion portion 101A accumulates is formed. A higher implantation energy is used for ion implantation of the n-type impurity 421 than that used for ion implantation of the n-type impurity 420. Accordingly, the first semiconductor region 151A is located below the third semiconductor region 153A. After the ion implantation, the mask pattern 411 is removed.

Figure 9D:
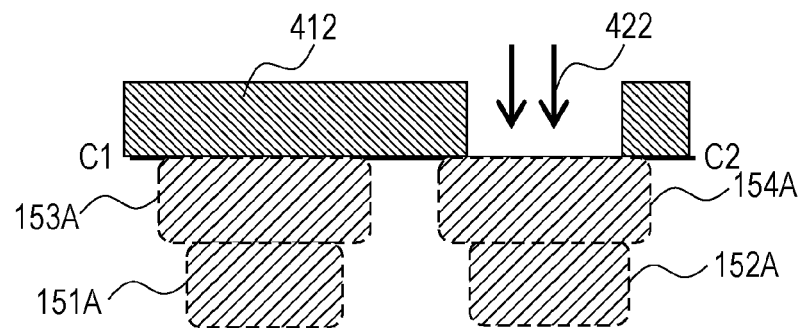

In a step illustrated in FIG. 9D, a mask pattern 412 is disposed. The mask pattern 412 has an opening at a region where the second photoelectric conversion portion 102A is to be formed. The mask pattern 412 is disposed over the region where the first photoelectric conversion portion 101A is formed. The mask pattern 412 is obtained by patterning a photoresist by photolithography, for example.

The semiconductor substrate 200 is doped with an n-type impurity 422 by ion implantation using the mask pattern 412. In this way, the second semiconductor region 152A in which a signal charge in the second photoelectric conversion portion 102A accumulates is formed. A higher implantation energy is used for ion implantation of the n-type impurity 422 than that used for ion implantation of the n-type impurity 420. Accordingly, the second semiconductor region 152A is located below the fourth semiconductor region 154A. After the ion implantation, the mask pattern 412 is removed.

According to the fabrication method illustrated in FIGS. 9A to 9D, a dose of the n-type impurity 421 is less than a dose of the n-type impurity 422. Accordingly, an impurity concentration of the first semiconductor region 151A in which a signal charge in the first photoelectric conversion portion 101A accumulates is lower than an impurity concentration of the second semiconductor region 152A in which a signal charge in the second photoelectric conversion portion 102A accumulates. This configuration can consequently make the potential at the first photoelectric conversion portion 101A higher than the potential at the second photoelectric conversion portion 102A.

Second Exemplary Embodiment

Figure 10:
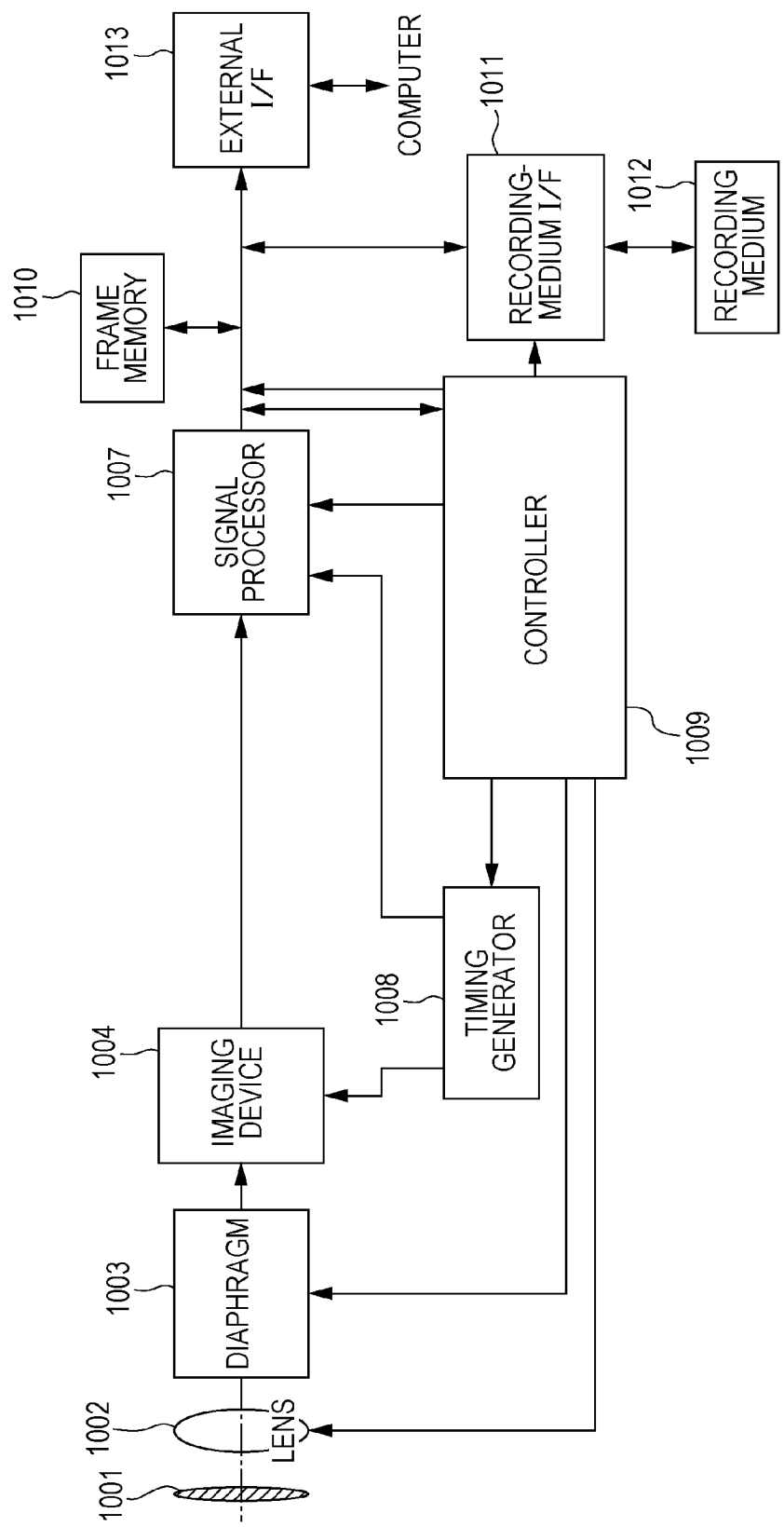
FIG. 10 is a block diagram illustrating an imaging system according to an exemplary embodiment.

An imaging system according to a second exemplary embodiment of the present invention will be described. Examples of the imaging system include a digital still camera, a digital camcorder, a copier, a fax, a mobile phone, an on-vehicle camera, and an observation satellite. FIG. 10 is a block diagram of a digital still camera which is an example of the imaging system.

Referring to FIG. 10, the imaging system includes a barrier 1001, a lens 1002, a diaphragm 1003, an imaging device 1004, a signal processor 1007, a timing generator 1008, a controller 1009, a frame memory 1010, a recording-medium interface (I/F) 1011, an external I/F 1013. The barrier 1001 protects the lens 1002. The lens 1002 forms an optical image of a subject onto the imaging device 1004. The diaphragm 1003 changes an amount of light that passes through the lens 1002. The imaging device 1004, which is the imaging device described above in the first exemplary embodiment, converts an optical image formed thereon by the lens 1002 into image data. It is assumed that an analog-to-digital (A/D) converter is formed on the semiconductor substrate of the imaging device 1004. The signal processor 1007 performs various kinds of corrections on imaging data output from the imaging device 1004 and compresses the data. The timing generator 1008 outputs various timing signals to the imaging device 1004 and the signal processor 1007 illustrated in FIG. 10. The controller 1009 controls the entire digital still camera. The frame memory 1010 temporarily stores image data. The recording-medium I/F 1011 is an interface for recording data on or reading data from a recording medium 1012. The recording medium 1012 is a removable recording medium, such as a semiconductor memory, onto which imaging data is recorded and from which imaging data is read out. The external I/F 1013 is an interface for communicating with an external computer. Note that timing signals or the like may be input from outside the imaging system, and the imaging system includes at least the imaging device 1004 and the signal processor 1007 that processes an imaging signal output from the imaging device 1004.

In the second exemplary embodiment, the configuration where the imaging device 1004 and the A/D converter are formed on the same semiconductor substrate has been described; however, the imaging device 1004 and the A/D converter may be formed on different semiconductor substrates. In addition, the imaging device 1004 and the signal processor 1007 may be formed on the same semiconductor substrate.

In addition, the signal processor 1007 may process a signal based on a charge generated by the first photoelectric conversion portion 101A and a signal based on a charge generated by the second photoelectric conversion portion 102A and may obtain information on a distance from the imaging device 1004 to a subject.

The imaging system according to the second exemplary embodiment uses the imaging device according to the first exemplary embodiment as the imaging device 1004. The application of the first exemplary embodiment of the present invention to the imaging system enables both an increased saturation charge quantity of a pixel and an increased accuracy of focus detection.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2014-107478, filed May 23, 2014, which is hereby incorporated by reference herein in its entirety.

What is claimed is:

1. An imaging device comprising:
 a pixel including
  a first photoelectric conversion portion including a first semiconductor region configured to accumulate a signal charge,
  a second photoelectric conversion portion including a second semiconductor region configured to accumulate a signal charge,
  a charge holding portion,
  a first transfer transistor configured to transfer a signal charge in the first photoelectric conversion portion to the charge holding portion, and
  a second transfer transistor configured to transfer a signal charge in the second photoelectric conversion portion to the charge holding portion; and
 a control unit configured to perform
  a first control operation to set the first transfer transistor to be on while keeping the second transfer transistor off from a state where both the first transfer transistor and the second transfer transistor are off, and
  after performing the first control operation, a second control operation to set a state in which both of the first transfer transistor and the second transfer transistor are on, wherein
 an impurity concentration of the first semiconductor region is lower than an impurity concentration of the second semiconductor region.

2. The imaging device according to claim 1, further comprising a semiconductor substrate having the first photoelectric conversion portion and the second photoelectric conversion portion thereon, wherein
 the first photoelectric conversion portion further includes a third semiconductor region disposed above the first semiconductor region, the third semiconductor region and the first semiconductor region having an identical conductivity type,
 the second photoelectric conversion portion further includes a fourth semiconductor region disposed above the second semiconductor region, the fourth semiconductor region and the second semiconductor region having an identical conductivity type,
 a width of the third semiconductor region is larger than a width of the first semiconductor region on a cross-section of the semiconductor substrate, and
 a width of the fourth semiconductor region is larger than a width of the second semiconductor region on the cross-section.

3. An imaging device comprising:
 a pixel including
  a first photoelectric conversion portion,
  a second photoelectric conversion portion,
  a charge holding portion, a first transfer transistor configured to transfer a signal charge in the first photoelectric conversion portion to the charge holding portion, and a second transfer transistor configured to transfer a signal charge in the second photoelectric conversion portion to the charge holding portion; and a control unit configured to perform a first control operation to set the first transfer transistor to be on while keeping the second transfer transistor off from a state where both the first transfer transistor and the second transfer transistor are off, and after performing the first control operation, a second control operation to set a state in which both of the first transfer transistor and the second transfer transistor are on, wherein for a signal charge, a potential of the first photoelectric conversion portion is higher than a potential of the second photoelectric conversion portion.

4. The imaging device according to claim 3, wherein the first photoelectric conversion portion includes a first semiconductor region configured to accumulate a signal charge, the second photoelectric conversion portion includes a second semiconductor region configured to accumulate a signal charge, and an impurity concentration of the first semiconductor region is lower than an impurity concentration of the second semiconductor region.

5. The imaging device according to claim 4, further comprising a semiconductor substrate having the first photoelectric conversion portion and the second photoelectric conversion portion thereon, wherein the first photoelectric conversion portion further includes a third semiconductor region disposed above the first semiconductor region, the third semiconductor region and the first semiconductor region having an identical conductivity type, the second photoelectric conversion portion further includes a fourth semiconductor region disposed above the second semiconductor region, the fourth semiconductor region and the second semiconductor region having an identical conductivity type, a width of the third semiconductor region is larger than a width of the first semiconductor region on a cross-section of the semiconductor substrate, and a width of the fourth semiconductor region is larger than a width of the second semiconductor region on the cross-section.

6. The imaging device according to claim 1, wherein the control unit performs the second control operation with at least part of the signal charge that has been transferred by the first control operation being held in the charge holding portion.

7. The imaging device according to claim 1, wherein the pixel further includes a reset transistor configured to reset voltage at the charge holding portion, and the control unit controls the reset transistor to reset the voltage at the charge holding portion between the first control operation and the second control operation.

8. The imaging device according to claim 1, wherein the control unit switches off both the first transfer transistor and the second transfer transistor between the first control operation and the second control operation.

9. The imaging device according to claim 1, wherein the pixel further includes an amplifying portion configured to output a signal based on a signal charge in the charge holding portion, and the charge holding portion includes a floating diffusion portion electrically connected to an input node of the amplifying portion.

10. The imaging device according to claim 1, wherein the pixel further includes an amplifying portion configured to output a signal based on a signal charge in the charge holding portion, and a third transfer transistor configured to transfer the signal charge in the charge holding portion to an input node of the amplifying portion.

11. The imaging device according to claim 1, wherein the pixel further includes an amplifying portion configured to output a signal based on a signal charge in the charge holding portion, and the charge holding portion includes a floating diffusion region configured to hold a signal charge that has been transferred thereto and a conductive member electrically connecting the floating diffusion region and the amplifying portion to each other.

12. The imaging device according to claim 11, wherein the floating diffusion region includes a fifth semiconductor region provided for the first photoelectric conversion portion and a sixth semiconductor region provided for the second photoelectric conversion portion, and the fifth semiconductor region and the sixth semiconductor region are electrically connected to each other by the conductive member included in the charge holding portion.

13. The imaging device according to claim 12, further comprising:

a first conductive member electrically connected to a gate electrode of the first transfer transistor; and a second conductive member electrically connected to a gate electrode of the second transfer transistor, wherein the first photoelectric conversion portion, the gate electrode of the first transfer transistor, and the fifth semiconductor region are arranged along a channel direction of the first transfer transistor, the second photoelectric conversion portion, the gate electrode of the second transfer transistor, and the sixth semiconductor region are arranged along a channel direction of the second transfer transistor, the first conductive member and the second conductive member extend along a direction crossing the channel directions of the first transfer transistor and the second transfer transistor, and at least part of the second conductive member is located in a region between the first conductive member and the conductive member included in the charge holding portion.

14. The imaging device according to claim 12, further comprising:

a first conductive member electrically connected to a gate electrode of the first transfer transistor; and a second conductive member electrically connected to a gate electrode of the second transfer transistor, wherein the first photoelectric conversion portion, the gate electrode of the first transfer transistor, and the fifth semiconductor region are arranged along a channel direction of the first transfer transistor, the second photoelectric conversion portion, the gate electrode of the second transfer transistor, and the sixth semiconductor region are arranged along a channel direction of the second transfer transistor, the first conductive member and the second conductive member extend along a direction crossing the channel directions of the first transfer transistor and the second transfer transistor, and at least part of the first conductive member is located in a region between the second conductive member and the conductive member included in the charge holding portion.

15. The imaging device according to claim 1, wherein the control unit supplies the first transfer transistor with a first control signal for switching on the first transfer transistor during the first control operation, a second control signal for switching on the first transfer transistor during the second control operation, and a third control signal for switching off the first transfer transistor, and a voltage difference between the first control signal and the third control signal is larger than a voltage difference between the second control signal and the third control signal.

16. The imaging device according to claim 1, wherein a potential barrier between the first photoelectric conversion portion and the second photoelectric conversion portion is lower than a potential barrier between the first photoelectric conversion portion and a photoelectric conversion portion of another pixel.

17. The imaging device according to claim 1, wherein the first semiconductor region and the second semiconductor region have areas that are equal to each other in plan view.

18. An imaging device comprising:

a pixel including a first photoelectric conversion portion including a first semiconductor region configured to accumulate a signal charge, a second photoelectric conversion portion including a second semiconductor region configured to accumulate a signal charge, a charge holding portion, a first transfer transistor configured to transfer a signal charge in the first photoelectric conversion portion to the charge holding portion, and a second transfer transistor configured to be controlled independently from the first transfer transistor and configured to transfer a signal charge in the second photoelectric conversion portion to the charge holding portion; and a lens provided correspondingly to the pixel, wherein an impurity concentration of the first semiconductor region is lower than an impurity concentration of the second semiconductor region.

19. An imaging system comprising:

the imaging device according to claim 1; and a signal processing device configured to process a signal output from the imaging device.

20. The imaging system according to claim 19, wherein the signal processing device processes a signal based on the signal charge in the first photoelectric conversion portion and a signal based on the signal charge in the second photoelectric conversion portion that are output from the imaging device and obtains information on a distance from the imaging device to a subject.

* * * * *